(12) United States Patent
Nishigawa et al.

(10) Patent No.: US 9,988,730 B2
(45) Date of Patent: Jun. 5, 2018

(54) METHOD OF FORMING A METAL LAYER AND METHOD OF MANUFACTURING A SUBSTRATE HAVING SUCH METAL LAYER

(71) Applicant: Atotech Deutschland GmbH, Berlin (DE)

(72) Inventors: Tadahiro Nishigawa, Fukushima (JP); Jun Higuchi, Berlin (DE); Hitoshi Ishikawa, Berlin (DE)

(73) Assignee: Atotech Deutschland GmbH, Berlin (DE)

( * ) Notice: Subject to any disclaimer, the term of this patent is extended or adjusted under 35 U.S.C. 154(b) by 0 days. days.

(21) Appl. No.: 15/127,433

(22) PCT Filed: Mar. 12, 2015

(86) PCT No.: PCT/EP2015/055201
§ 371 (c)(1),
(2) Date: Sep. 20, 2016

(87) PCT Pub. No.: WO2015/144443
PCT Pub. Date: Oct. 1, 2015

(65) Prior Publication Data
US 2017/0130354 A1   May 11, 2017

(30) Foreign Application Priority Data
Mar. 24, 2014  (JP) ................. 2014-060460

(51) Int. Cl.
*C25D 5/34* (2006.01)
*C25D 3/38* (2006.01)
(Continued)

(52) U.S. Cl.
CPC ............. *C25D 5/34* (2013.01); *C25D 3/38* (2013.01); *H05K 1/0296* (2013.01); *H05K 3/424* (2013.01);
(Continued)

(58) Field of Classification Search
CPC .................... C25D 5/34; C25D 3/38
See application file for complete search history.

(56) References Cited

U.S. PATENT DOCUMENTS 5,571,365 A * 11/1996 Maehata ............... C09J 163/00
156/326
5,575,898 A * 11/1996 Wolf ....................... C25D 5/54
205/125
(Continued)

FOREIGN PATENT DOCUMENTS

DE          60200891        8/2005
EP          0553671         8/1993
(Continued)

OTHER PUBLICATIONS

Coombs: "Printed Circuites Handbook Sixth Ed.", Jan. 1, 2008, pp. 28.1-28.12, XP055279188.
(Continued)

*Primary Examiner* — Stefanie S Wittenberg
(74) *Attorney, Agent, or Firm* — Renner, Otto, Boisselle & Sklar, LLP

(57) ABSTRACT

In a substrate like a printed circuit board comprising an insulator and a copper layer laminated on part of the insulator, said insulator outer surface and said copper layer outer surface are simultaneously subjected to a process (1) comprising treatment with an alkali metal hydroxide solution, a process (2) comprising treatment with an alkaline aqueous solution containing an aliphatic amine, a process (3) comprising treatment with an alkaline aqueous solution having a permanganate concentration of 0.3 to 3.5 wt % and a pH of 8 to 11, a process (4) comprising treatment with an acidic microemulsion aqueous solution containing a thiophene compound and an alkali metal salt of polystyrenesul-
(Continued)

phonic acid, and a process (5) comprising copper electroplating, which are implemented sequentially.

18 Claims, 3 Drawing Sheets

(51) Int. Cl.
H05K 3/46 (2006.01)
H05K 3/42 (2006.01)
H05K 1/02 (2006.01)

(52) U.S. Cl.
CPC ....... *H05K 3/467* (2013.01); *H05K 2201/032* (2013.01)

(56) References Cited

U.S. PATENT DOCUMENTS

| | | | |
|---|---|---|---|
| 7,025,867 B2 | 4/2006 | Czeczka et al. | |
| 7,416,763 B2 | 8/2008 | Kanda et al. | |
| 9,713,266 B2 | 7/2017 | Nichols et al. | |
| 2004/0112755 A1 | 6/2004 | Czeczka et al. | |
| 2005/0097735 A1 | 5/2005 | Kanda et al. | |
| 2007/0298170 A1 | 12/2007 | Kronenberg et al. | |
| 2010/0323174 A1* | 12/2010 | Nagasaki | B05D 5/067 428/209 |

FOREIGN PATENT DOCUMENTS

| | | |
|---|---|---|
| EP | 1897974 | 3/2008 |
| WO | 2013143732 | 10/2013 |

OTHER PUBLICATIONS

PCT/EP2015/055201; PCT International Search Report and Written Opinion of the International Searching Authority dated May 29, 2015.
PCT/EP2015/055201; PCT International Preliminary Report on Patentability dated Jun. 27, 2016.
Official Action for corresponding Chinese Application No. 201580015062.2 dated Jan. 5, 2018.

* cited by examiner

US 9,988,730 B2

METHOD OF FORMING A METAL LAYER AND METHOD OF MANUFACTURING A SUBSTRATE HAVING SUCH METAL LAYER

The present application is a U.S. National Stage Application based on and claiming benefit and priority under 35 U.S.C. § 371 of International Application No. PCT/EP2015/055201, filed 12 Mar. 2015, which in turn claims benefit of and priority to Japanese Application No. 2014-060460 filed 24 Mar. 2014, the entirety of both of which is hereby incorporated herein by reference.

FIELD OF THE INVENTION

The present invention relates to a method of forming a metal layer with which it is possible to form an electroplated copper layer simultaneously on an insulator outer surface and on a copper layer outer surface of a board comprising an insulator and said copper layer laminated on part of the insulator, and to a method of manufacturing a printed circuit board employing the same.

BACKGROUND OF THE INVENTION

In recent years, concomitant with size and weight reductions, functionality increases and price reductions of various types of analogue and digital equipment for consumer and industrial use, printed circuit boards have changed from being single-sided boards to double-sided boards, and moreover development of fine-pitch multilayer boards is progressing rapidly. In a process for machining double-sided and multilayer boards a method is conventionally implemented whereby, as a pre-treatment before electroplating copper onto the insulator outer surface of through holes, blind holes and the like in which the insulator is exposed, a noble metal catalyst treatment employing a palladium compound is performed, after which chemical copper plating is performed, and then copper electroplating is performed. Increasing costs of noble metal catalyst treatment and chemical copper plating due to steep rises in the price of palladium, which is a noble metal catalyst raw material, and concerns over the effects on the human body of the environmentally harmful substance formalin, which is a reducing agent in chemical copper plating, have led to investigations of techniques which do not use these substances. Of these, a method of forming an electrically conductive polymer film directly on the insulator outer surface is attracting attention because it allows both the noble metal catalyst treatment and chemical copper plating to be omitted.

Polyanilines, polypyrroles, polyfuranes, polythiophenes and the like are known as electrically conductive polymers used for the abovementioned purpose, and methods of forming films have been proposed which employ these in the form of liquid mixtures with alkanesulphonic acids, polystyrenesulphonic acid and salts thereof. However, the long-term liquid stability of these treatment liquids is poor, and because the electrical conductivity of the electrically conductive polymer film is low there are portions in which the electroplated copper layer does not form. Other problems have also been identified, for example in that the stability over time of the electrically conductive polymer film is poor and the film deteriorates over time. Further, the adhesive strength between the insulator and the layer of copper plating is weak, and is not at a sufficient level to allow it to be used as a printed circuit board, and it can thus only be adopted in a very small portion of such applications.

A prior-art method for forming an electrically conductive polymer film and a layer of copper plating on the outer surface of an insulator will now be described.

Patent literature article 1 for example discloses a method in which the outer surfaces of a polymer or ceramic substrate are treated using an oxidising solution such as a permanganate, after which a monomer such as pyrrole, furan or thiophene is deposited, and then an electrically conductive polymer is formed by oxidative polymerization using peroxodisulphuric acid, for example.

Patent literature article 2 for example describes a method of forming a through hole in a copper laminated plate and a multilayer plate, subjecting the same to a potassium permanganate treatment as an oxidising pre-treatment, performing a monomeric thiophene microemulsion treatment, subsequently or simultaneously performing acid treatment using polystyrenesulphonic acid to generate an electrically conductive layer, and electrodepositing a metal onto this.

Patent literature article 3 proposes a method in which a cleaned printed circuit board, through which a hole has been made, is cleaned using a neutral permanganate solution and is then subjected to acid cleaning to eliminate metal oxides on the copper foil and thereby solve the problem of poor adhesion between the copper foil and the electroplated copper, and the problem of the appearance of boundaries in connecting portions.

Patent literature article 4 proposes bringing a nonconductive substrate outer surface into contact with a water-soluble polymer, next treating this with a permanganate solution, then treating this with a microemulsion solution of a thiophene compound and an alkanesulphonic acid, and performing electroplating.

Patent literature article 5 proposes a method of subjecting a printed circuit board having a machined hole to a direct metallization treatment, wherein a manganese dioxide layer is formed by means of an alkaline permanganate treatment, after which hydroxides are washed using an acidic solution and this is then neutralised using an alkaline aqueous solution, after which a conductive film is formed using a microemulsion of 3,4-ethylenedioxythiophene, polystyrenesulphonic acid, and a mixture thereof, thereby improving the covering ability of the copper plating and its ability to attach around the hole portions, and making it possible to ensure a reproducible production process.

Patent literature article 6 proposes a method in which a board comprising an insulating substrate of epoxy resin or the like, laminated on both sides with copper, is subjected to blind microvia machining, and this is plated directly using an electrically conductive polymer, colloidal particles including a noble metal, or electrically conductive carbon particles.

From among the patent literature recited hereinabove, the method recited in patent literature article 4, in which an electrically conductive polymer film is formed using a microemulsion solution of a thiophene compound and an alkanesulphonic acid, has excellent solution stability and electrically conductive polymer film stability, and further the covering properties during copper plating are also excellent.

However, in all of the abovementioned prior art, when copper electroplating was performed on a portion of a polyimide resin or an epoxy resin which had been subjected to an electrically conductive polymer treatment, and a copper pattern with a pitch of 80 μm (the cycle comprising the total of the line width and the space being 80 μm, the same applies hereinafter) was created using a photolithographic method and was observed under a microscope, a critical defect, namely peeling of part of the copper pattern, was already visible at the time of pattern formation, and moreover when observed after an adhesive tape peeling test had been performed, multiple occurrences of copper pattern peeling were identified. When the adhesive strength of these specimens was measured at room temperature (hereinafter: normal condition adhesive strength), the adhesive strength was found to be low, at 1.9 N/cm or less, and locational variation was large. Further, when the adhesive strength of these specimens was measured after having been heat-treated in air at 150° C. for 158 hours (hereinafter: adhesive strength after heat resistance), the adhesive strength was even lower, at 0.8 N/cm or less, and peeling of the pattern between the insulator and the copper occurred readily in almost all locations. It was thus determined that these methods could not be applied to printed circuit boards for applications in which they are subjected to high-temperature soldering (280° C.) for mounting of components or to machining in a high-temperature atmosphere (approximately 400° C.) when mounting ICs, or for applications in which they are used in a high-temperature condition.

Further, when manganese dioxide is formed on the insulator outer surface during permanganate treatment, sometimes manganese hydroxide in the form of a fine powder is also formed on the copper layer outer surface at the same time. Manganese hydroxide has a weak oxidising power, and an electrically conductive polymer does not form on the copper layer, but during copper electroplating copper protuberances of between several μm to several tens of μm are generated due to the manganese hydroxide in the form of a fine powder. In addition, if a copper circuit pattern is formed by means of a photolithographic method, tearing and cissing of the photosensitive resist occurs. In addition, in the copper protuberance portions a difference arises in the etching speed as a result of differences in the thickness of the copper film, and in the same way as with the drawbacks mentioned hereinabove, breaks in the copper pattern, shorts, voids, protuberances and the like occur and the product yield is reduced markedly, and it was determined that these methods could not be applied to printed circuit boards having a pitch of 80 μm or less.

PRIOR ART LITERATURE

Patent Literature

[Patent literature article 1] Japanese Patent No. 2657423
[Patent literature article 2] Japanese Patent No. 2733461
[Patent literature article 3] Japanese Patent Kokai 1996-139451
[Patent literature article 4] Japanese Patent No. 4686113
[Patent literature article 5] Japanese Patent No. 3804981
[Patent literature article 6] EP2566311

SUMMARY OF THE INVENTION

Problems to be Solved by the Invention

In the abovementioned method of forming a printed circuit board in which an electrically conductive polymer film is formed directly on an insulator outer surface, and a layer of copper plating is then formed, it was determined that the adhesive strength (normal condition and after heat resistance) between the insulator and the layer of copper plating is low, and that the method cannot be applied when high-temperature soldering is used to mount components or when machining occurs in a high-temperature atmosphere during mounting of ICs, or to such applications, and it was also determined that the yield is reduced as a result of the generation of copper protuberances on the copper plating outer surface, and the method cannot be applied to printed circuit boards having a pitch of 50 to 80 μm, constituting the majority of double-sided printed circuit boards.

The present invention takes account of the abovementioned situation, and its objects are to provide a method of forming a metal layer which has excellent adhesive strength (normal condition and after heat resistance), which can prevent the generation of copper protuberances during copper plating, and which can also be applied to printed circuit board applications having a pitch of 80 μm or less, and to provide a method of manufacturing a printed circuit board employing the same.

Means of Overcoming the Problem

In order to solve the abovementioned problems, the present invention is a method of forming a metal layer characterised in that, in a board comprising an insulator and a copper layer laminated on part of the insulator, said insulator outer surface and said copper layer outer surface are simultaneously subjected to a process (1) comprising treatment with an alkali metal hydroxide solution, a process (2) comprising treatment with an alkaline aqueous solution containing an aliphatic amine, a process (3) comprising treatment with an alkaline aqueous solution having a permanganate concentration of 0.3 to 3.5 wt % and a pH of 8 to 11, a process (4) comprising treatment with an acidic microemulsion aqueous solution containing a thiophene compound and an alkali metal salt of polystyrenesulphonic acid, and a process (5) comprising copper electroplating, which are implemented sequentially.

Further, it was found that by performing a process (3A) of treating with an acidic aqueous solution after performing the treatment in abovementioned process (3) using an alkaline aqueous solution of permanganate, and then sequentially implementing the treatments from process (4) onward, an electroplated copper layer having excellent smoothness and surface quality is formed on said copper layer outer surface.

Advantages of the Invention

According to the present invention, since it is possible to ensure reliability and quality suitable for practical use as a printed circuit board, by improving the adhesion properties (normal condition and after heat resistance) and improving the smoothness and the surface quality of the copper outer surface, a printed circuit board can be provided by means of an electrically conductive polymer/copper electroplating method which does not require a costly noble metal catalyst as used in conventional methods, namely a noble metal catalyst/chemical copper method, and which does not use formalin, which is an environmentally harmful substance.

DETAILED DESCRIPTION

Figure 1:
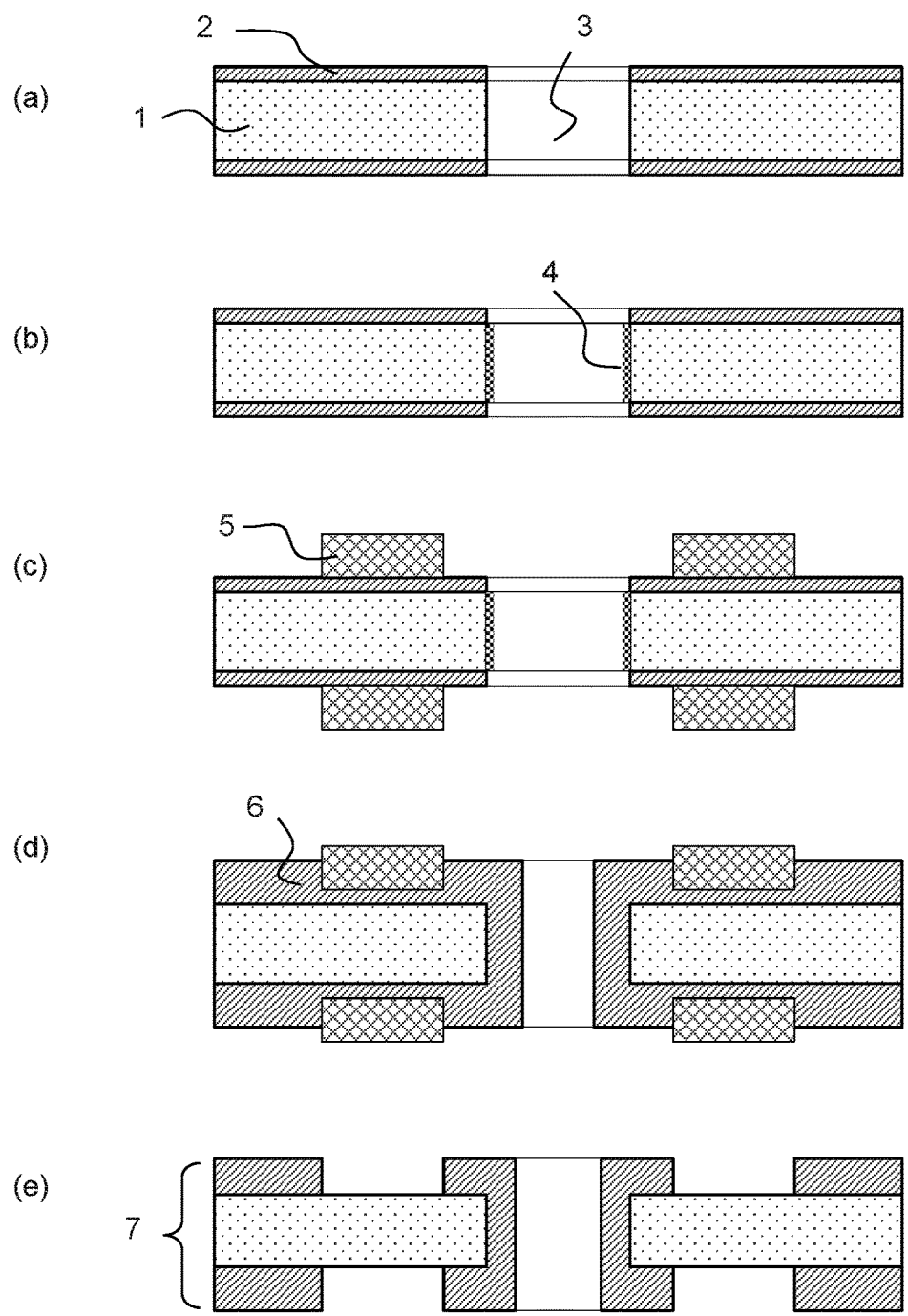
FIG. 1 Schematic diagram of a subtractive process according to the present invention
FIG. 2 Schematic diagram of a semi-additive process according to the present invention
FIG. 3 Schematic diagram of a test coupon.

In order to solve the abovementioned problems, the present invention is characterised in that, in a board comprising an insulator and a copper layer laminated on part of the insulator, said insulator outer surface and said copper layer outer surface are simultaneously subjected to a process (1) comprising treatment with an alkali metal hydroxide solution (also referred to below simply as "process (1)"), a process (2) comprising treatment with an alkaline aqueous solution containing an aliphatic amine (also referred to below simply as "process (2)"), a process (3) comprising treatment with an alkaline aqueous solution having a permanganate concentration of 0.3 to 3.5 wt % and a pH of 8 to 11 (also referred to below simply as "process (3)"), a process (4) comprising treatment with an acidic microemulsion aqueous solution containing a thiophene compound and an alkali metal salt of polystyrenesulphonic acid (also referred to below simply as "process (4)"), and a process (5) comprising copper electroplating (also referred to below simply as "process (5)"), which are implemented sequentially.

Further, preferably, treatment with an acidic aqueous solution is performed by implementing a process (3A) comprising treatment with an acidic aqueous solution (also referred to below simply as "process (3A)") after implementing the abovementioned process (3) treatment using an alkaline aqueous solution of permanganate, and the treatments from (4) onward are then implemented sequentially.

Examples of insulators that can be used in the present invention include polyimide resins and epoxy resins. Polyimide resins or those which have been modified by the addition of polysiloxane, polycarbonate, polyester or the like can be used as a polyimide resin. A glass epoxy board comprising a combination of an epoxy resin and glass fibre (heat resistant glass cloth substrate epoxy resin copper-clad laminated board), or the same modified to have a low thermal expansion and a high glass-transition temperature, constituting a high glass-transition temperature glass epoxy board, can for example be used as an epoxy resin.

It is also possible to use an arrangement in which a copper layer has been laminated on part of said insulators, e.g., an arrangement in which copper foil has been bonded by means of a bonding agent, or an arrangement in which a copper layer has been formed by means of a dry method or a wet method such as sputtering or vapour deposition followed by copper electroplating, or an arrangement comprising a thermoplastic polyimide resin and a copper layer laminated together, or an arrangement in which a single or multiple types of polyimide resin have been flow-cast laminated onto a copper layer. These may also be used laminated into multiple layers. It should be noted that the thickness of the copper layer is preferably 0.05-35 μm.

In the treatment of process (1), in which an alkali metal hydroxide solution is used, an alkali metal hydroxide solution such as sodium hydroxide, potassium hydroxide or lithium hydroxide can be used in order to enhance cleaning of the copper layer outer surface and cleaning, activation and hydrophilicity of the exposed insulator outer surface. Further, in the case of a polyimide resin, monoethanolamine, hydrazine or the like may be added to said solution in order to promote ring-opening of the imide ring.

The contact angle between water and the resin outer surface after treatment with the alkali metal hydroxide solution is preferably 15° to 55°. If the contact angle is 55° or less, many carboxyl groups, hydroxyl groups and the like, which are ionic polar groups, appear on the insulator outer surface, binding of amino groups in the subsequent process (2) increases, and the amount of manganese dioxide formed in process (3) can be adequately increased, the conductive film resistance in process (4) is reduced, and the ability of the copper plating to attach around holes during copper electroplating in process (5) is satisfactory. Also, a value of 15° or more is preferable in that the resin outer surface is activated to a suitable degree, and the conductive film does not exhibit a brown colour and adhesive strength is not markedly reduced as a result of an excess of manganese dioxide or manganese hydroxide remaining on the insulator outer surface.

In order to obtain the abovementioned contact angle, the alkali metal hydroxide solution preferably has a pH of 12 or more and the treatment temperature is preferably 55° C. or less. With a pH of 12 or more when the treatment temperature is 55° C. or less, the insulator is activated, the amount of manganese dioxide formed by process (3) can be controlled optimally, the resistance of the conductive film is reduced, and the adhesive strength can be improved.

Further, a non-ionic surfactant such as polyoxyethylene nonylphenyl ether can also be added to increase the cleaning and wetting effects further.

In addition, if holes are machined in a polyimide resin or glass epoxy board using a laser, the abovementioned alkali metal hydroxide solution treatment can be implemented after implementation for example of an ultraviolet irradiation treatment or a treatment using permanganate for removing carbides generated by the laser irradiation.

Next, process (2) is implemented by performing a treatment with an alkaline aqueous solution containing an aliphatic amine, whereby a robust adhesive strength can be realised between the insulator/electrically conductive polymer/layer of copper plating. Aliphatic amines constituting nitrogen-containing basic compounds which may be used include: alkylamines, aliphatic alkanolamines, and alicyclic amines. Among these, aliphatic primary amines and aliphatic secondary amines are preferable from the point of view of reactivity, more specifically methanolamine, ethanolamine, dimethanolamine, diethanolamine, N-methyl ethanolamine, ethyleneimine, diglycolamine, polyallylamine, polyvinylamine, polydiallylamine, polyvinylamidine, polyethyleneimine and the like are preferable.

The reasons for adding these aliphatic amines are as follows. For example, in the case of a polyimide resin, resistance to organic solvents and acid is excellent, but polyamic acid is produced due to hydrolysis under alkali conditions. It is therefore assumed that the surface is further activated and the adhesive strength is increased as a result of reaction of primary amines or secondary amines, which are aliphatic amines exhibiting basicity, and carboxyl groups of polyamic acid, in addition to ionic polar groups which appear because the alkali metal hydroxide solution is present, and the formation of amide bonds.

The aliphatic amine concentration is preferably 0.1 to 10 wt % in order to produce the sufficient required surface activation.

For the abovementioned reasons, in process (2), the aliphatic amine must be in the form of an alkaline aqueous solution. The pH is preferably adjusted to between 9 and 13 using sodium hydroxide or sulphuric acid. It is assumed that in this pH range, carboxyl groups further appear at the insulating substrate outer surface activated by the alkali metal hydroxide solution treatment, and these bond with the primary amines or secondary amines and amide bonding is promoted, and as a result a high adhesive strength is readily obtained.

Further, by adding a water-soluble organic solvent such as isopropyl alcohol or ethylene glycol to the abovementioned aqueous solution, a more stable adhesive strength can be obtained.

Further, a non-ionic surfactant such as polyoxyethylene alkyl ether can be added in order to remove foreign matter that remains attached to the insulator in process (1), and to increase wetting performance.

Next, in process (3) the substrate is immersed in an alkaline aqueous solution having a permanganate concentration of 0.3 to 3.5 wt % and a pH of 8 to 11, and a manganese dioxide layer is formed on the insulator outer surface. Sodium permanganate, potassium permanganate and the like can be used as the permanganate solution, and sulphuric acid, sodium hydroxide or the like can be used to adjust the pH.

The permanganate concentration must be between 0.3 and 3.5 wt %, and the pH must be in the range of 8 to 11. If the permanganate concentration is less than 0.3 wt % then the amount of electrically conductive polymer film that forms is reduced and the electrical conductivity deteriorates. Thus the ability to attach around holes during copper plating deteriorates, generating portions with no adhered copper. When portions with no adhered copper are generated during copper plating, the board cannot be used as a circuit board because there is an increase in current density at the surface of the copper in the vicinity thereof, and hydrogen gas is generated, and as a result the conductive film is partially removed and the adhesive strength also deteriorates. Further, if it is 3.5 wt % or more then a large amount of manganese hydroxide is formed on the insulator outer surface together with the manganese dioxide, and manganese dioxide that is not consumed in forming the electrically conductive polymer film remains, causing the adhesive strength to deteriorate. Also, manganese hydroxide on the copper layer causes copper protuberances to be generated during copper electroplating, and circuit breaks, shorts and the like are generated during circuit pattern formation, causing the yield to deteriorate. Further, the colour tone exhibited by the electrically conductive polymer changes from colourless and transparent to a fine powder-like dark brown colour. Thus the adhesive strength between the insulator/electrically conductive polymer/copper deteriorates and locational variation thereof increases, and thus the board cannot be used as a printed circuit board.

With regard to the pH range, if the pH is less than 8 then the amount of manganese dioxide that forms increases, the adhesive strength deteriorates and copper pattern peeling occurs due to the effect of the remaining manganese dioxide. If the pH is greater than 11, the amount of manganese dioxide that forms decreases, and accompanying this the amount of conductive film that is formed decreases and the resistance value increases, a greater amount of time is taken until copper is formed on the surface of the conductive film, part of the conductive film is dissolved and removed in the copper plating solution during this time, and as a result the adhesive strength deteriorates, peeling occurs, and the board cannot be used as a printed circuit board.

Further, with regard to the adhesive strength after heat resistance, it was determined that a practical level of adhesive strength after heat resistance can only be obtained if the permanganate concentration and pH are in accordance with the abovementioned optimal conditions and the process is performed as a continuation of the previous processes, namely a process (1) comprising treatment with an alkali metal hydroxide solution, and a process (2) comprising treatment with an alkaline aqueous solution containing an aliphatic amine. With regard to the polyimide resin, a difference was seen in the degree to which copper is diffused to the polyimide resin layer in a sample having a strong adhesive strength after heat resistance and a sample having a weak adhesive strength after heat resistance, the adhesive strength tending to increase as the degree of scattering of the copper to the polyimide resin layer reduces. It is assumed that by performing both processes sequentially the imide rings on the polyimide resin outer surface are hydrophilised by the alkali metal hydroxide solution and are ring-opened, the primary amine or secondary amine bonds thereto, the manganese dioxide bonds via the amide bonds, and further the electrically conductive polymer bonds by means of the oxidising power of the manganese dioxide, and thus the polyimide resin/electrically conductive polymer/copper bonds are strengthened and diffusion of the copper is suppressed.

It should be noted that if an alkaline aqueous solution of permanganate is used in an environment in which a large amount of liquid is brought into or is taken out from a previous process, a buffering agent such as boric acid or sodium carbonate, and a non-ionic surfactant having a draining effect can be added with the aim of stabilising the pH of the solution.

Next, the substrate which has been subjected to the abovementioned permanganate treatment is preferably treated with an acidic solution in process (3A), because it is possible in this way to remove manganese hydroxide in the form of a fine powder attached to the copper layer outer surface and to improve the smoothness and the surface quality of the plated surface obtained after copper electroplating.

Sulphuric acid, hydrochloric acid or the like can be used as the acid employed in the acidic solution, and the pH is preferably 3.0 to 5.5. If the pH is 5.5 or less, the copper layer outer surface is dissolved and manganese hydroxide in the form of a fine powder attached to said surface can be removed, and a copper plating film having a smooth outer surface can be formed by copper electroplating in process (5). Further, a pH of 3.0 or more is preferable in that the copper does not dissolve even if the copper layer is a thin film of 0.1 μm or less, exposure of the underlying insulator, causing the electrically conductive polymer layer not to be formed and generating non-adhesion of the copper plating, also does not occur, and there are no occurrences of failures whereby the amount of electrically conductive polymer that forms is reduced due to the dissolution and removal of manganese dioxide that has formed on the insulator, leading to a deterioration in the ability to attach around holes during copper plating and generating portions with no adhered copper.

Next, in process (4), the abovementioned treated substrate is immersed in an acidic microemulsion aqueous solution containing a thiophene compound and an alkali metal salt of polystyrenesulphonic acid, and the monomer is oxidised by the manganese dioxide attached to the insulator outer surface and an electrically conductive polymer film is formed.

The thiophene compound can preferably be selected from the group comprising 3-heterosubstituted thiophenes and 3,4-diheterosubstituted thiophenes, and can more preferably be selected from the group comprising 3,4-ethylenedioxythiophene, 3-methoxy-thiophene, 3-methyl-4-methoxy-thiophene and derivatives of the same. This can be made into a water-based microemulsion solution by adding for example sodium polystyrene sulphonate, which is an alkali metal salt of polystyrenesulphonic acid, and forming a mixture. Next, by adjusting the pH to between 1 and 3 using an alkanesulphonic acid such as methanesulphonic acid or ethanesulphonic acid and making it into an acidic microemulsion solution, an electrically conductive polymer (a conjugate of polyethylenedioxythiophene and polystyrenesulphonic acid)

can be formed easily in a single process by immersing the insulator to which the manganese dioxide is attached into said solution. According to the description corresponding to patent literature article 4, the microemulsion is aqueous (at least 50% by volume), and can include lower aliphatic alcohols, esters and ethyl esters.

Microemulsions are emulsions containing extremely small droplets (diameter 5 to 100 nm). They are thus optically transparent and thermodynamically stable, and do not separate into two phases for a long time after manufacture. In this way, in a method in which treatment is performed using a conventional polyethylenedioxythiophene film-forming liquid, after which treatment is performed in a separate tank using a polystyrenesulphonic acid film-forming liquid, degradation of the latter liquid by liquid being brought in can be avoided, and a stable electrically conductive polymer layer can be formed.

Specifically, the "Seleo" (direct plating method registered trademark) CPF1 series chemical liquids sold by Atotech Japan KK can be used. The "Seleo" CPF1 series treatment processes are performed in the following sequence: etch cleaner process (outer surface cleaning)/conditioner process (regulation, activation of outer surface)/adhesion promoter process (permanganate treatment)/polyconductor process (polymer formation by oxidative polymerization of a monomer), and of these only the polyconductor process can be used in the present invention. The polyconductor process can use a single liquid comprising a mixture of two liquids, namely "Seleo CP Basic Plus", a solution containing 5 to 10 wt % of 3,4-ethylenedioxythiophene, and "Seleo CP Matrix Plus", a solution containing 2.5 to 5 wt % of sodium polystyrene sulphonate. An electrically conductive polymer film can be formed by immersing an insulator substrate that has been subjected to treatments in processes (1), (2) and (3) into this liquid mixture.

After formation of said film, the next process, namely copper electroplating, may be implemented while in a state in which the substrate is wet with water, but copper electroplating may also be performed after hot-air drying (100° C., 1 hour) or after being allowed to stand at room temperature.

For the copper electroplating it is preferable to use a copper sulphate bath which can support through holes and blind holes. Copper plating can for example be performed with the addition of copper sulphate, sulphuric acid or chloride ions (added using hydrochloric acid), to which a leveller (smoothing agent) and a brightener (brightening agent) have been added.

In order to manufacture a printed circuit board using the method of forming a metal layer of the present invention, in the case of a semi-additive construction method (FIG. 1), a through hole 3 is opened using a drill or the like in a substrate comprising an insulator 1 on both sides of which copper layers 2 have been formed (FIG. 1(a)), and an electrically conductive polymer film 4 is formed on the side wall of the through hole in which the insulator is exposed (FIG. 1(b)). Next, a circuit pattern 5 is formed for example by lamination/exposure/development of a photosensitive dry film resist (FIG. 1(c)), and a copper electroplating layer 6 is formed on the exposed portions of the copper layer and the electrically conductive polymer film (FIG. 1(d)). A printed circuit board 7 can then be formed by peeling off the dry film and removing the copper layer thereunder by etching (FIG. 1(e)).

Figure 2:
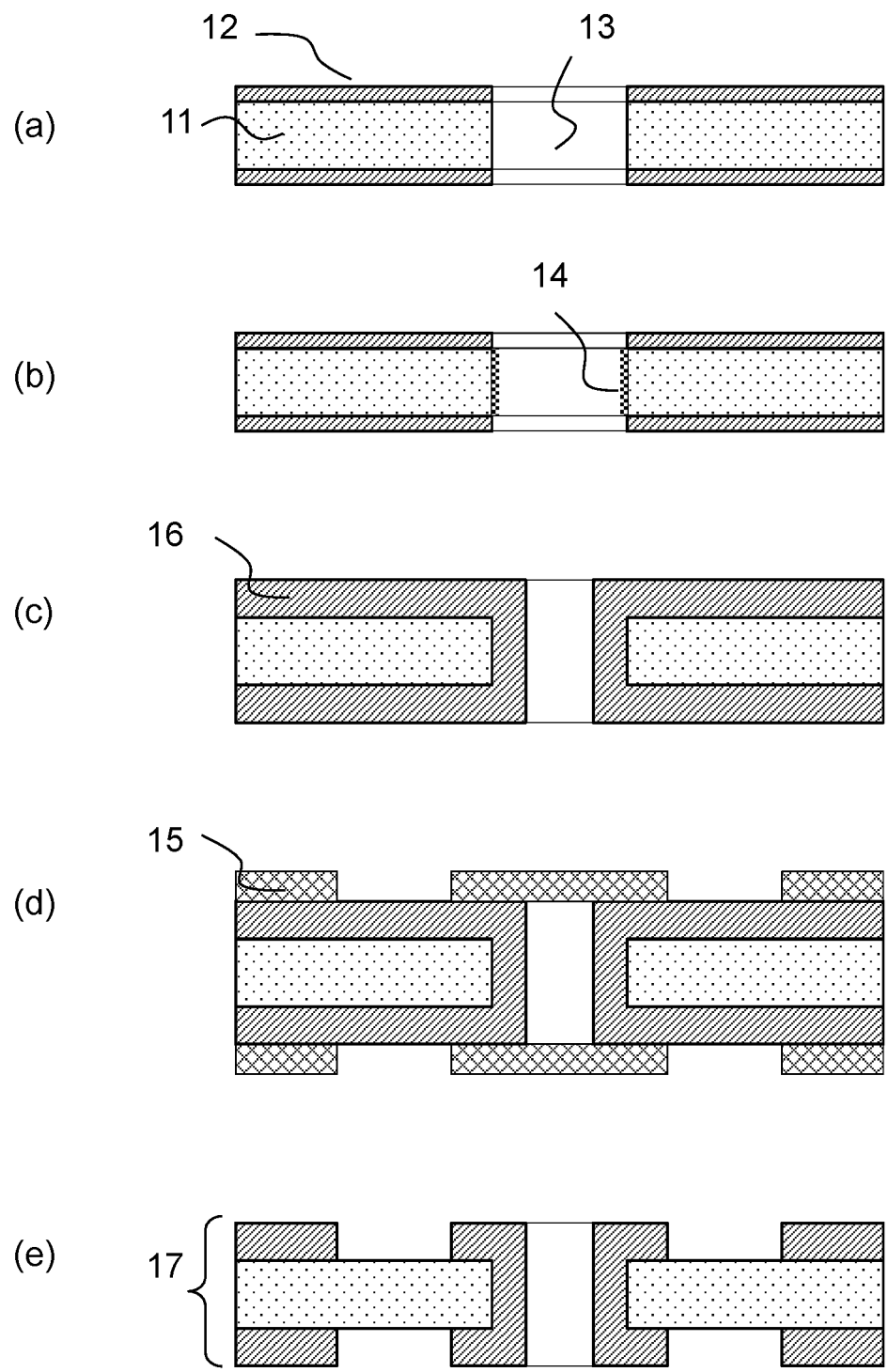

Further, when forming a circuit board using a subtractive construction method (FIG. 2), a through hole 13 is opened using a drill or the like in a substrate comprising an insulator 11 on both sides of which copper layers 12 have been formed (FIG. 2(a)), and an electrically conductive polymer film 14 is formed on the side wall of the through hole in which the insulator is exposed, after which a copper electroplating layer 16 is formed on all surfaces (FIG. 2(b)), and a photosensitive dry film is then laminated/exposed/developed to form a circuit pattern 15 (FIG. 2(c)), and after etching the layer of copper plating and the copper layer (FIG. 2(d)), a printed circuit board 17 can be formed by peeling off the dry film after etching the layer of copper plating and the copper layer (FIG. 2(e)).

Further, depending on the intended use of the printed circuit board, in both cases tin, nickel, palladium, silver, gold, platinum and alloys thereof can be electrolytically or non-electrolytically coated onto the copper circuit pattern either individually or in combination.

Also, a printed circuit board having a blind hole can also be manufactured using the method of forming a metal layer of the present invention. In the case of a blind hole, the copper layer on one surface and the insulator are removed by laser machining or by chemical etching, in the process in which a through hole is opened, leaving only the copper layer on the reverse surface. Then, in the case of the semi-additive construction method (FIG. 1) for example, an electrically conductive polymer film 4 is formed on the side wall of the blind hole in which the insulator is exposed, after which implementation can proceed using the same processes as mentioned hereinabove.

A layer other than the copper layer may equally be provided on the abovementioned board. For example, a layer of a metal other than copper constituting an adhesion reinforcing layer may equally be laminated by this procedure on at least one surface of the insulator. By providing an adhesion reinforcing layer which can be removed by etching, e.g. a nichrome layer or the like, between the insulator and the copper layer, it is possible to further improve adhesion of the insulator and the copper layer without this leading to a change in the method of circuit manufacture.

The evaluation method and measurement method for the method of forming a metal layer of the present invention were in accordance with the following methods.

A. Evaluation of Absence or Presence of Non-Adhesion of Copper Plating

Figure 3:
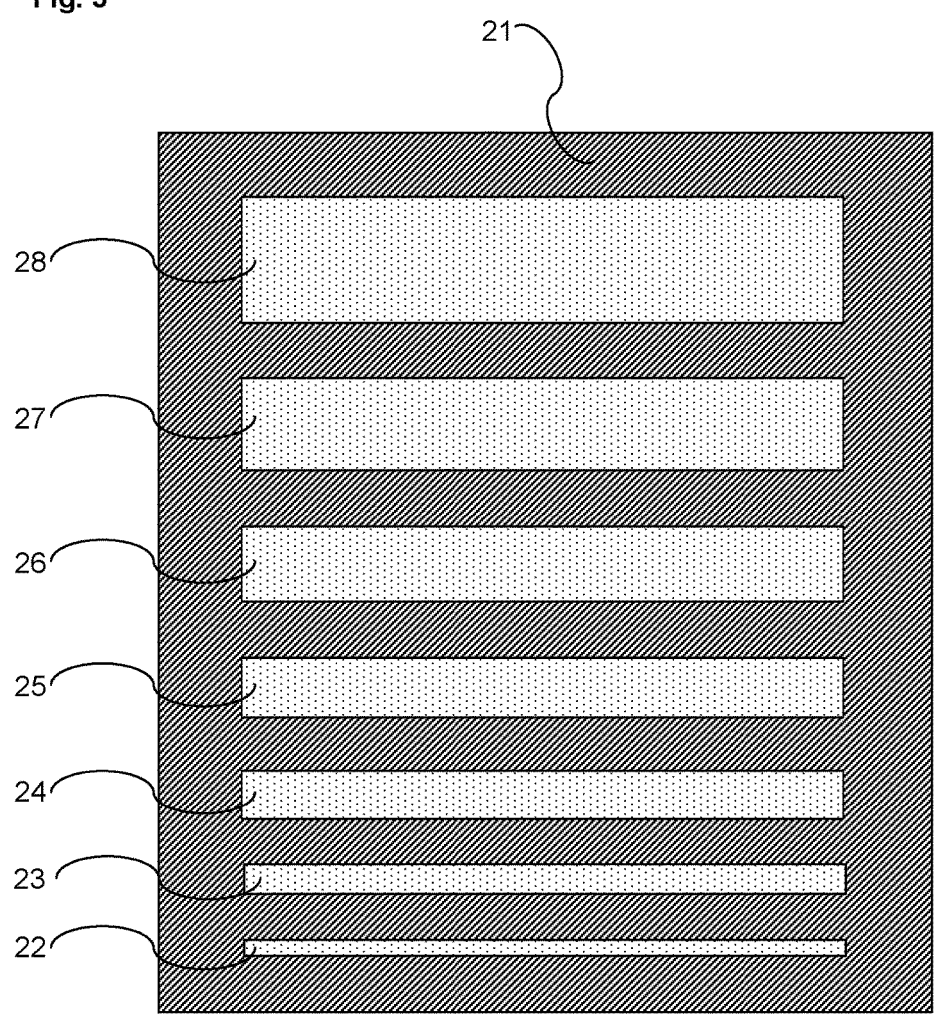

This was performed using the test coupon illustrated in FIG. 3. The test coupon was prepared by forming in advance a 12 nm nichrome layer as an adhesion reinforcing layer on one surface of a polyimide resin using a sputtering method, then forming a 0.15 μm copper layer using a sputtering method, and then laminating a dry film resist, exposing and developing it using a photolithographic method, and removing the copper layer and the adhesion reinforcing layer 21 by etching to expose the resin portion. Resin exposed portions were made in seven steps, from a 1 mm width (reference symbol 22) to an 8 mm width (reference symbol 28), representing long through holes or blind holes in a multi-layer board. Non-adhesion of copper plating was evaluated by performing copper electroplating (15 μm) on said test coupon at 2 A/dm² under various conditions, and observing visually and under a microscope the presence or absence of non-adhered copper in all positions in the resin exposed portions of width 1 mm to width 8 mm. For pass or fail judgement, if non-adhesion of copper does not occur over the full width of the abovementioned resin exposed portion then this is deemed to be a pass, and if non-adhesion of copper occurs in even one position then this is deemed to be a fail (NG).

B. Evaluation of Copper Pattern Peeling and Adhesive Strength (Normal Condition, after Heat Resistance)

With regard to copper pattern peeling, the test coupon in FIG. 3 was subjected to copper electroplating (15 µm) using the abovementioned method, and a copper pattern having a pitch of 80 µm (line/space: 40 µm/40 µm) was formed on the 5 mm width to 8 mm width resin exposed portions using a photolithographic method. After formation of the copper pattern the presence or absence of peeling during pattern formation was observed using a microscope and a pass or fail judgement was made.

Next, if peeling had not occurred then a Sellotape (registered trademark) test was performed, the presence or absence of peeling of the copper pattern was observed using a microscope for 100 lines, and a pass or fail judgement was performed by defining that if there was no peeling of any of the 100 lines then this was deemed to be a pass, and if there was peeling of even one line then this was deemed to be a fail (NG). In the adhesive tape test, Nichiban Co., Ltd cellophane tape LT-24 was used and was adhered to and peeled from the copper pattern in accordance with JIS K5600 (cross-cut test). The specimen after heat treatment for 158 hours at 150° C. in a hot-air oven was also subjected to an adhesive tape test performed in the same way as described hereinabove, and a pass or fail judgement was made.

For evaluation of the adhesive strength, said test coupon was subjected to copper electroplating (15 µm) using the abovementioned method, a 0.8 mm×42 mm copper pattern was formed in the vicinity of the centre of each of the resin exposed portions of width 1 mm to width 8 mm using a photolithographic method, and the 90° copper peeling adhesive strength was measured using an Orientec Co., Ltd Tensilon RTC-1150A in accordance with IPC-TM-650, the maximum and minimum values were omitted and an evaluation was made using the average value. Also, with regard to the adhesive strength after heat resistance, measurements were taken using the same method as described hereinabove after said pattern had been subjected to heat treatment in a hot-air oven at 150° C. for 158 hours. For the pass or fail judgement of the adhesive strength, if pattern peeling did not occur during copper pattern formation or in the adhesive tape test prior to the subsequent heat resistance adhesive strength measurement, and if a stable adhesive strength of 3.0 N/cm or more (in both normal condition and after heat resistance) was obtained, with little variation in strength difference during the 90° copper peeling adhesive strength measurement, then this was deemed to be a pass.

C. Evaluation of Ability to Attach Copper Plating Around Through Hole Portions

A 12 nm nichrome layer and a 0.15 µm copper layer were formed on both surfaces (10×10 cm) of an insulator using a sputtering method, after which φ100 µm through holes were machined using a drill and copper electroplating (15 µm) was performed using the same method as described hereinabove. After copper plating, the through holes were subjected to cross-sectional cutting using a microtome and were observed using a microscope, and the presence or absence of copper non-adhesion in the hole portions was observed for 100 holes, and a pass or fail judgement was performed by defining that if there was no non-adhesion in any of the 100 holes then this was deemed to be a pass, and if there was non-adhesion in even one hole then this was deemed to be a fail (NG).

D. Evaluation of Pattern Formability

A circuit pattern was formed by copper electroplating (15 µm) using the same method as described hereinabove, using the abovementioned specimen with copper on both surfaces in which through holes had been machined, after which a pattern having a pitch of 80 µm (40 µm/40 µm×length 18 mm) was formed by a photolithographic method, and said pattern was observed using a microscope (for defects such as breaks, shorts, voids, protuberances and the like). Voids and projections having a line width of 40 µm±30% were deemed to be defects, 1,000 lines were observed, and a pass or fail judgement was performed by defining that if there were none of the abovementioned defects in any of the 1,000 lines then this was deemed to be a pass, and if there were defects in even one line then this was deemed to be a fail (NG).

E. Measurement of Aqueous Solution pH

In accordance with JIS Z8802, a DKK-TOA Corporation pH meter HM-305 was regulated after zero calibration using a phthalate pH standard solution (pH 4.01) and a neutral phosphate pH standard solution (pH 6.86), and measurements were made.

F. Measurement of Contact Angle of Insulator Outer Surface after Treatment with Alkali Metal Hydroxide Solution In accordance with JIS K6768, pure water was added dropwise onto the outer surface of an insulator, and measurements were made using a Kyowa Interface Science Co., Ltd contact angle meter CA-X.

G. Overall Determination

The abovementioned items A-D were evaluated and where all the items were deemed to be a pass then this was deemed to be a pass overall, and where even one of the items was deemed to be a fail (NG) then this was deemed to be a fail (NG) overall.

EXAMPLES

The effect of the present invention will now be described with reference to embodiments.

Examples 1 to 4

A 10 cm×10 cm substrate ("Metaloyal": manufactured by Toray Advanced Film Co., Ltd) comprising a polyimide film ("Kapton" 150EN-A38 µm: manufactured by Du Pont-Toray Co., Ltd) on both surfaces of which a 12 nm nichrome layer and a 0.15 µm copper layer had been formed by a sputtering method and through which φ100 µm through holes had been machined using a drill, and the test coupon in FIG. 2, manufactured by the method discussed hereinabove, were used. Each of these was immersed in an alkali metal aqueous hydroxide solution (sodium hydroxide 20 g/l the pH of which had been adjusted to 13.7 by the addition of polyoxyethylene nonylphenyl ether 0.1 g/l) at 40° C. for 1 minute, and was washed in water (water contact angle 30°), after which each was immersed in an alkaline aqueous solution containing an aliphatic amine (polyethylenimine 10 g/l, ethylene glycol 5 ml/l, to which polyoxyethylene polyoxypropylene glycol 0.05 m/l had been added and the pH adjusted to 11.5 using sodium hydroxide) at 50° C. for 1 minute, and was washed in water. Each was next immersed for 3 minutes in a liquid (60° C.) comprising a 0.3 wt % sodium permanganate solution the pH of which had been adjusted to 8, 9, 10, 11 using sodium hydroxide. Embodiments 1, 2, 3, 4 correspond respectively to the substrates prepared using the solutions having each of the abovementioned pH values. After being washed with water, they were soaked for 1 minute in pH 4.0 diluted sulphuric acid (room temperature) and were then immersed for 1 minute in a solution (20° C.) comprising a mixture of 60 ml/l of "Seleo" CPF1 Series polyconductor process aqueous solution "Seleo" CP Matrix Plus manufactured by Atotech Japan KK and 20 ml/l of "Seleo" CP Basic Plus, the pH of which had been adjusted to 2.0, forming an electrically conductive polymer film. They were then washed with water and hot-air dried at 100° C. for 3 minutes. They were next subjected to copper electroplating (15 μm) at 2 A/dm$^2$ using a copper sulphate plating solution (copper sulphate 150 g/l, sulphuric acid 120 g/l, chloride ions (added using hydrochloric acid) 50 mg/l, leveller ("Basic Leveller Cupracid" HL) 30 ml/l, brightener ("Correction Cupracid" GS) 0.05 ml/l).

The hole portions of the copper plated items machined with through-holes were subjected to cross-sectional cutting using a microtome and were observed using a microscope. The results showed that the ability to attach around the hole portions was satisfactory in all 100 holes, and defects such as non-adhesion of copper plating or peeling were not observed. Further, a circuit pattern having a pitch of 80 μm (line/space: 40 μm/40 μm×length 18 mm) was formed on said copper plating outer surface and was observed using a microscope, and the results showed that a satisfactory outer surface condition had been obtained, without any defects such as pattern breaks or shorts being observed in any of the 1,000 lines. Next, the copper plating outer surface in the 1 mm wide to 8 mm wide resin exposed portions in the test coupons in FIG. 3 was observed visually and using a microscope, but abnormalities such as non-adhesion of copper plating could not be found. In addition, a pattern have a pitch of 80 μm (line/space: 40 μm/40 μm) was formed on the copper plating outer surface in the 5 mm wide to 8 mm wide resin exposed portions of said test coupons, and after confirming by microscopic observation that there was no pattern peeling an adhesive tape test was performed, and the result of microscopic observations showed that copper pattern peeling could not be found in any of the 100 lines. Further, an adhesion test pattern having a width of 0.8 mm was formed on the abovementioned 1 mm wide to 8 mm wide resin exposed portions, and the normal condition adhesive strength was measured in accordance with IPC-TM-650, the results being as shown in Table 1. Under each of the conditions an adhesive strength of 4.0 N/cm or more was obtained, a high adhesive strength of 6.6 N/cm being obtained with a pH of 10. In addition, high values of 3.0 N/m or more were obtained under each of the conditions for the adhesive strength after heat resistance for the same specimens. From these results it can be seen that metal layers having satisfactory surface quality and high adhesive strength (normal condition, after heat resistance) were obtained.

Comparative Examples 1 to 4

In embodiment 1, the pH of the sodium permanganate having a concentration of 0.3 wt % was modified to 4, 6, 7, 12 using sodium hydroxide and sulphuric acid, and copper electroplating (15 μm) was performed with all the other conditions remaining unchanged. Comparative examples 1, 2, 3, 4 correspond respectively to the substrates prepared using the solutions having each of the abovementioned pH values. The evaluation results are shown in Table 1. According to Table 1, a normal condition adhesive strength of 1.9 N/cm was obtained with pH values of 7 and 12, but in each of the 80 μm pitch pattern adhesive tape tests, peeling was observed in 7 of the 100 lines, and they therefore failed. With pH values of 4 and 6 the normal condition adhesive strength was 1.5 N/cm or less, locational variation was large and pattern peeling during copper pattern formation was confirmed, and these therefore failed.

Examples 5 to 8

In embodiment 1, the pH of sodium permanganate having a concentration of 3.5 wt % was varied to 8, 9, 10, 11 using sodium hydroxide, and copper electroplating (15 μm) was performed with all the other conditions remaining unchanged. Embodiments 5, 6, 7, 8 correspond respectively to the substrates prepared using the solutions having each of the abovementioned pH values. The evaluation results are shown in Table 1. According to Table 1, under each of the conditions an adhesive strength of 4.0 N/cm or more was obtained without the occurrence of non-adhesion of copper or copper pattern peeling, a value of 6.5 N/cm being obtained with a pH of 10. Further, high values of 3.0 N/m or more were obtained under each of the conditions for the adhesive strength after heat resistance for the same specimens. Other evaluations also yielded similar results to embodiment 1, and metal layers having satisfactory copper surface quality and high adhesive strength (normal condition, after heat resistance) were obtained.

Comparative Examples 5 to 8

In embodiment 1, the pH of sodium permanganate having a concentration of 3.5 wt % was varied to 4, 6, 7, 12 using sodium hydroxide, and copper electroplating (15 μm) was performed with all the other conditions remaining unchanged. Comparative examples 5, 6, 7, 8 correspond respectively to the substrates prepared using the solutions having each of the abovementioned pH values. The evaluation results are shown in Table 1. According to Table 1, copper plating non-adhesion was not found under any of the conditions, but with pH values of 4 and 6 peeling occurred during pattern formation, and these therefore failed. Peeling was not observed during pattern formation with pH values of 7 and 12, but in each of the 80 μm pitch pattern adhesive tape tests, peeling was observed in 8 of the 100 lines, and they therefore failed. Further, the normal condition adhesive strength was low with pH values of 7 and 12, at 1.9 N/cm and 1.8 N/cm, and the adhesive strength was even lower with pH values of 4 and 6, at 1.5 N/cm or less, and moreover locational variation was observed, and these therefore failed.

Comparative Examples 9 to 12

In embodiment 1, the pH of sodium permanganate having a concentration of 0.2 wt % was varied to 4, 6, 9, 11 using sodium hydroxide, and copper electroplating (15 μm) was performed with all the other conditions remaining unchanged. Comparative examples 9, 10, 11, 12 correspond respectively to the substrates prepared using the solutions having each of the abovementioned pH values. The evaluation results are shown in Table 1. According to Table 1, in relation to copper plating onto the test coupons, non-adhesion of copper plating was observed for all pH values with respect to 4 mm wide to 8 mm wide resin exposed portions, and they therefore failed. Further, the normal condition adhesive strength in said coupons had a value of 1.0 N/cm or less for each pH value, locational variation was large and pattern peeling during copper pattern formation was confirmed, and these therefore failed. Also with regard to the through hole portions, non-adhesion of copper was observed over the full range, and these therefore failed.

Comparative Examples 13 to 21

In embodiment 1, the pH of sodium permanganate having a concentration of 4.0 wt % was varied to 4, 5, 6, 7, 8, 9, 10, 11, 12 using sodium hydroxide, and copper electroplating (15 μm) was performed with all the other conditions remaining unchanged. Comparative examples 13, 14, 15, 16, 17, 18, 19, 20, 21 correspond respectively to the substrates prepared using the solutions having each of the abovementioned pH values. The evaluation results are shown in Table 1. According to Table 1, non-adhesion of copper plating was not observed, but peeling was confirmed during copper pattern formation with pH values of 4, 5, 7, 8, 9, 11, 12, and in the 80 μm pitch pattern adhesive tape tests, peeling was observed in 6 of the 100 lines with pH values of 6 and 10, and they therefore failed. Normal condition adhesive strengths having values of 1.8 N/cm and 1.9 N/cm were obtained with pH values of 6 and 10, but of 1.5 N/cm or less under all other conditions, locational variation was large and pattern peeling during copper pattern formation was confirmed, and these therefore failed. Further, the ability to attach around the through-hole portions was satisfactory, but when circuit pattern formability was evaluated with pH values of 6 and 10, breaks, shorts and the like, assumed to have been caused by copper protuberances, were observed in both cases in 10 or more of the 1,000 lines, and they therefore failed.

Comparative Example 22

Copper electroplating (15 μm) was performed under the same conditions as in embodiment 1 from process (1) onward, but without performing the treatment with an aqueous alkali metal solution of process (1) and treatment with an alkaline aqueous solution containing an aliphatic amine of process (2), this being comparative example 22. The evaluation results are shown in Table 1. According to Table 1, the ability to attach around the through-hole portions was satisfactory, circuit pattern formability was satisfactory, and non-adhesion of copper plating and copper pattern peeling under normal conditions were not found, in addition to which normal condition adhesive strength was stable at 3.5 N/cm, thereby passing the test, but the adhesive strength after heat resistance was low at 0.3 N/cm and also pattern peeling of the 80 μm pitch copper pattern occurred after heat resistance, and this therefore failed.

Comparative Example 23

Copper electroplating (15 μm) was performed under the same conditions as in embodiment 1, except that the treatment with an alkaline aqueous solution containing an aliphatic amine of process (2) was not performed, this being comparative example 23. The evaluation results are shown in Table 1. According to Table 1, the ability to attach around the through-hole portions was satisfactory, circuit pattern formability was satisfactory, and non-adhesion of copper plating and copper pattern peeling under normal conditions were not found, in addition to which normal condition adhesive strength was stable at 4.0 N/cm, but the adhesive strength after heat resistance was low at 0.7 N/cm and also pattern peeling of the 80 μm pitch copper pattern occurred after heat resistance, and this therefore failed.

Comparative Example 24

Copper electroplating (15 μm) was performed under the same conditions as in embodiment 1, except that the treatment with an aqueous alkali metal solution of process (1) was not performed. The substrate in which the abovementioned aqueous alkali metal solution treatment was omitted was comparative example 24. The evaluation results are shown in Table 1. According to Table 1, the ability to attach around the through-hole portions was satisfactory, circuit pattern formability was satisfactory, and non-adhesion of copper plating and copper pattern peeling under normal conditions were not found, in addition to which normal condition adhesive strength was stable at 4.0 N/cm, but the adhesive strength after heat resistance was low at 1.2 N/cm and also peeling of the 80 μm pitch copper pattern after heat resistance was found in the adhesive tape test in 5 of the 100 lines, and this therefore failed.

Example 9

Copper electroplating (15 μm) was performed under the same conditions as in embodiment 1, except that soaking for 1 minute in pH 4.0 diluted sulphuric acid (room temperature) was omitted, this being embodiment 9. The evaluation results are shown in Table 1. According to Table 1, copper plating non-adhesion and copper pattern peeling were not observed. Adhesive strength was also high, clearing 3.0 N/cm, being 6.4 N/cm under normal conditions and 4.0 N/cm after heat resistance. Further, the through-hole portions were subjected to cross-sectional cutting using a microtome and were observed using a microscope, and no non-adhesion of copper or abnormalities at the hole portions were observed in any of the 100 holes, and this was thus satisfactory. Next, an 80 μm pitch circuit pattern was formed and was observed using a microscope, and the results showed that projections and defects thought to have been caused by manganese hydroxide were observed in 3 lines, but all were within ±15% of the line width, and the result was therefore 0/1,000, which was a pass. From these results it can be seen that metal layers having satisfactory surface quality and high adhesive strength (normal condition, after heat resistance) were obtained.

Example 10

A specimen comprising the substrate with copper on both surfaces, of embodiment 1, in which φ50 μm through holes had been machined using a press was treated using the same method as in embodiment 1, forming an electrically conductive polymer film. Next a negative type photosensitive dry film resist manufactured by DuPont ("Riston" JSF120: film thickness 20 μm) was laminated, and on one surface (the signal surface) a 50 μm pitch (line/space: 25 μm/25 μm) semi-additive circuit pattern was formed by exposure/development, and on the reverse surface (the ground surface) a 150 μm pitch (line/space: 75 μm/75 μm) semi-additive circuit pattern was formed by exposure/development. This was next subjected to copper electroplating (15 μm) at 2 A/dm$^2$ using a copper sulphate plating solution (copper sulphate 150 g/l, sulphuric acid 120 g/l, chloride ions 50 mg/l, "Basic Leveller Cupracid" HL 30 ml/l, "Correction Cupracid" GS 0.05 ml/l). The dry film resist was then peeled off using a 1 wt % sodium hydroxide aqueous solution, and the copper layer under the dry film resist and the nichrome layer, which is an adhesive strength reinforcing layer, were dissolved using a ferric chloride etching solution, and a circuit pattern was formed. The copper circuit pattern portion was then subjected to 0.5 μm non-electrolytic tin plating, and a circuit board for mounting an IC was prepared. The through holes were subjected to cross-sectional cutting using a microtome and were observed using a microscope, the result showing that the ability to attach around the hole portions was satisfactory. Further, defects such as breaks, shorts, voids and protuberances were not seen in the circuit patterns on either surface. A satisfactory printed circuit board having an adhesive strength or 6.0 N/cm under normal conditions and 3.8 N/cm after heat resistance on both surfaces was thus obtained.

Example 11

Negative-type photosensitive dry film resists ("Riston" JSF120: film thickness 20 μm) were laminated onto both surfaces of a substrate with copper on both surfaces onto which a 12 nm nichrome layer had been formed using the sputtering method of embodiment 1 and a 2 μm copper layer had been formed by electroplating a substrate on which a 0.15 μm copper layer had been formed, after which a pattern in which the copper layer was exposed to a diameter of φ50 μm was formed on only one surface (the signal surface) of the dry film resist using a photolithographic method. The copper layer and the nichrome layer were then dissolved using a ferric chloride etching solution, after which the polyimide resin was etched using a polyimide etching liquid (TPE300 manufactured by Toray Engineering), and with only the nichrome layer on the reverse surface (the ground surface) being dissolved using a ferric chloride etching solution and the copper layer remaining in place, the dry film resist was peeled off using a 1 wt % sodium hydroxide aqueous solution, forming a blind hole with a copper layer on both surfaces. Said specimen was treated under the same conditions as in embodiment 1 to form an electrically conductive polymer film. Next, using the same method as in embodiment 10, a 50 μm pitch (line/space: 25 μm/25 μm) circuit pattern was formed on the signal surface and a 150 μm pitch (line/space: 75 μm/75 μm) circuit pattern was formed on the ground surface. The blind holes were subjected to cross-sectional cutting using a microtome and were observed using a microscope, the result showing that the ability to attach around the hole portions was satisfactory. Further, defects such as breaks, shorts, voids and protuberances were not seen in the circuit patterns on either surface. A satisfactory printed circuit board having an adhesive strength of 5.8 N/cm under normal conditions and 3.5 N/cm after heat resistance on both surfaces was thus obtained.

TABLE 1

| Embodiment | Comparative example | Treatment process | | | | | | | | Evaluation results | | | | | | |
|---|---|---|---|---|---|---|---|---|---|---|---|---|---|---|---|---|
| | | Alkaline aqueous solution | | Permanganate (wt %) | (pH) | Acid | Electrically conductive polymer | Copper plating | | Test coupon | | | | Ability to attach around hole portion | Substrate 10 cm × 10 cm Circuit pattern formability | Overall determination |
| | | Alkali metal hydroxide | aqueous solution | | | | | Electro-plating | non-adhesion | Copper pattern peeling | | Adhesion strength (N/cm) | | | | |
| | | | | | | | | | | Normal condition | After heat-resistance | Normal condition | After heat-resistance | | | |
| 1 | | ○ | | 0.3 | 8 | ○ | ○ | ○ | Pass | Pass | Pass | 4.2 | 3.3 | Pass | Pass | Pass |
| 2 | | ○ | | 0.3 | 9 | ○ | ○ | ○ | Pass | Pass | Pass | 5.5 | 3.8 | Pass | Pass | Pass |
| 3 | | ○ | | 0.3 | 10 | ○ | ○ | ○ | Pass | Pass | Pass | 6.6 | 4.0 | Pass | Pass | Pass |
| 4 | | ○ | | 0.3 | 11 | ○ | ○ | ○ | Pass | Pass | Pass | 4.4 | 3.4 | Pass | Pass | Pass |
| | 1 | ○ | | 0.3 | 4 | ○ | ○ | ○ | Pass | NG (Peeling) | | 0.9 | | | | NG |
| | 2 | ○ | | 0.3 | 6 | ○ | ○ | ○ | Pass | NG (Peeling) | | 1.4 | | | | NG |
| | 3 | ○ | | 0.3 | 7 | ○ | ○ | ○ | Pass | NG (7/100) | | 1.9 | | | | NG |
| | 4 | ○ | | 0.3 | 12 | ○ | ○ | ○ | Pass | NG (7/100) | | 1.9 | | | | NG |
| 5 | | ○ | | 3.5 | 8 | ○ | ○ | ○ | Pass | Pass | Pass | 4.1 | 3.1 | Pass | Pass | Pass |
| 6 | | ○ | | 3.5 | 9 | ○ | ○ | ○ | Pass | Pass | Pass | 5.6 | 3.8 | Pass | Pass | Pass |
| 7 | | ○ | | 3.5 | 10 | ○ | ○ | ○ | Pass | Pass | Pass | 6.5 | 4.3 | Pass | Pass | Pass |
| 8 | | ○ | | 3.5 | 11 | ○ | ○ | ○ | Pass | Pass | Pass | 4.5 | 3.5 | Pass | Pass | Pass |
| | 5 | ○ | | 3.5 | 4 | ○ | ○ | ○ | Pass | NG (Peeling) | | 1.0 | | | | NG |
| | 6 | ○ | | 3.5 | 6 | ○ | ○ | ○ | Pass | NG (8/100) | | 1.3 | | | | NG |
| | 7 | ○ | | 3.5 | 7 | ○ | ○ | ○ | Pass | NG (3/100) | | 1.9 | | | | NG |
| | 8 | ○ | | 3.5 | 12 | ○ | ○ | ○ | Pass | NG (Peeling) | | 1.8 | | | | NG |
| | 9 | ○ | | 0.2 | 4 | ○ | ○ | ○ | Non-adhesion | | | 0.6 | | Non-adhesion | | NG |
| | 10 | ○ | | 0.2 | 6 | ○ | ○ | ○ | Non-adhesion | | | 0.8 | | Non-adhesion | | NG |
| | 11 | ○ | | 0.2 | 9 | ○ | ○ | ○ | Non-adhesion | | | 0.9 | | Non-adhesion | | NG |
| | 12 | ○ | | 0.2 | 11 | ○ | ○ | ○ | Non-adhesion | | | 0.8 | | Non-adhesion | | NG |
| | 13 | ○ | | 4.0 | 4 | ○ | ○ | ○ | Pass | NG (Peeling) | | 0.6 | | Pass | | NG |
| | 14 | ○ | | 4.0 | 5 | ○ | ○ | ○ | Pass | NG (6/100) | | 1.3 | | | | NG |
| | 15 | ○ | | 4.0 | 6 | ○ | ○ | ○ | Pass | NG (Peeling) | | 1.8 | | | NG (10/100) | NG |
| | 16 | ○ | | 4.0 | 7 | ○ | ○ | ○ | Pass | NG (Peeling) | | 1.3 | | | | NG |
| | 17 | ○ | | 4.0 | 8 | ○ | ○ | ○ | Pass | NG (Peeling) | | 1.3 | | | | NG |
| | 18 | ○ | | 4.0 | 9 | ○ | ○ | ○ | Pass | NG (Peeling) | | 1.4 | | | | NG |
| | 19 | ○ | | 4.0 | 10 | ○ | ○ | ○ | Pass | NG (Peeling) | | 1.9 | | | NG (15/100) | NG |
| | 20 | ○ | | 4.0 | 11 | ○ | ○ | ○ | Pass | NG (Peeling) | | 1.4 | | | | NG |
| | 21 | ○ | | 4.0 | 12 | ○ | ○ | ○ | Pass | Pass | NG (Peeling) | 1.2 | | | | NG |
| | 22 | ○ | | 0.3 | 10 | ○ | ○ | ○ | Pass | Pass | NG (Peeling) | 3.5 | 0.3 | Pass | Pass | NG |
| | 23 | | ○ | | | ○ | ○ | ○ | Pass | Pass | NG (Peeling) | 4.0 | 0.7 | Pass | Pass | NG |
| | 24 | ○ | ○ | 0.3 | 10 | ○ | ○ | ○ | Pass | Pass | NG (5/100) | 4.0 | 1.2 | Pass | Pass | NG |
| 9 | | ○ | ○ | 0.3 | 10 | ○ | ○ | ○ | Pass | Pass | Pass | 6.4 | 4.0 | Pass | Pass | Pass |

EXPLANATION OF THE REFERENCE NUMBERS 1, 11 insulator
2, 12 copper layer
3, 13 through hole
4, 14 electrically conductive polymer
5, 15 circuit pattern
6, 16 electroplated copper layer
7, 17 printed circuit board
21 copper layer and adhesion reinforcing layer
22 resin exposed portion (1 mm×42 mm)
23 resin exposed portion (2 mm×42 mm)
24 resin exposed portion (3 mm×42 mm)
25 resin exposed portion (4 mm×42 mm)
26 resin exposed portion (5 mm×42 mm)
27 resin exposed portion (6 mm×42 mm)
28 resin exposed portion (8 mm×42 mm)

The invention claimed is:

1. A method of forming a metal layer on an insulator outer surface and on a copper layer outer surface of a substrate comprising an insulator and said copper layer laminated on part of the insulator, characterised in that simultaneously said insulator outer surface and the copper layer outer surface are subjected to a process (1) comprising treatment with an alkali metal hydroxide solution, a process (2) comprising treatment with an alkaline aqueous solution containing an aliphatic amine, a process (3) comprising treatment with an alkaline aqueous solution having a permanganate concentration of 0.3 to 3.5 wt % and a pH of 8 to 11, a process (4) comprising treatment with an acidic microemulsion aqueous solution containing a thiophene compound and an alkali metal salt of polystyrenesulphonic acid, and a process (5) comprising copper electroplating, which are implemented sequentially.

2. The method of forming a metal layer according to claim 1, characterised in that after the abovementioned process (3), a process (3A) comprising treatment with an acidic aqueous solution is performed, then the processes from (4) onward are implemented sequentially.

3. The method of forming a metal layer according to claim 1, characterised in that the insulator is a polyimide resin or an epoxy resin.

4. The method of forming a metal layer according to claim 1, characterised in that the contact angle of the insulator outer surface after the abovementioned (1) treatment with an alkali metal hydroxide solution is 15° to 55°.

5. The method of forming a metal layer according to claim 1, characterised in that the pH of the alkaline aqueous solution containing an aliphatic amine in the abovementioned process (2) is in the range of 9 to 13.

6. The method of forming a metal layer according to claim 2, characterised in that the pH of the acidic aqueous solution in the abovementioned (3A) is in the range of 3.0 to 5.5.

7. The method of forming a metal layer according to claim 1, characterised in that the substrate is an electronic substrate having a metal layer circuitry structure.

8. The method of forming a metal layer according to claim 7 characterised in that the electronic substrate is an IC substrate, a printed circuit board or lead frame.

9. The method of forming a metal layer according to claim 7 characterised in that the electronic substrate is a multilayer printed circuit board.

10. The method of forming a metal layer according to claim 2, characterised in that the contact angle of the insulator outer surface after the abovementioned (1) treatment with the alkali metal hydroxide solution is 15° to 55°.

11. The method of forming a metal layer according to claim 2, characterised in that the pH of the alkaline aqueous solution containing an aliphatic amine in the abovementioned (2) is in the range of 9 to 13.

12. The method of forming a metal layer according to claim 4, characterised in that the pH of the alkaline aqueous solution containing an aliphatic amine in the abovementioned (2) is in the range of 9 to 13.

13. A method of manufacturing a printed circuit board characterised in that a board comprising an insulator sheet and a copper layer laminated onto both sides of said insulator sheet is used, holes penetrating through from the front to the back of said board are provided, an electrically conductive polymer layer is provided on insulator wall surfaces of said through holes by simultaneously subjecting said insulator outer surface and the copper layer outer surface to the following processes (1)-(4) in this sequence: (1) a process comprising treatment with an alkali metal hydroxide solution, (2) a process comprising treatment with an alkaline aqueous solution containing an aliphatic amine, (3) a process comprising treatment with an alkaline aqueous solution having a permanganate concentration of 0.3 to 3.5 wt % and a pH of 8 to 11, (4) a process comprising treatment with an acidic microemulsion aqueous solution containing a thiophene compound and an alkali metal salt of polystyrenesulphonic acid, after which a patterned mask is formed on the copper layer on the insulator sheet outer surface using a photolithographic method, the copper layer not covered by said patterned mask and the insulator wall surfaces in the through holes are subjected to (5) a copper electroplating process after which the patterned mask is removed, and thereafter only the copper layer portion that was covered by the patterned mask is removed by etching, thereby forming a patterned circuit and forming a layer of copper plating on the through hole wall surfaces.

14. The method of manufacturing a printed circuit board according to claim 13, characterised in that after the patterned circuit has been formed on the copper layer, plating is performed using tin, nickel, palladium, silver, gold, platinum or alloys thereof, individually or in combination.

15. The method of manufacturing a printed circuit board according to claim 13, characterised in that a metal layer other than copper constituting an adhesion reinforcing layer and a copper layer are laminated by this procedure on at least one surface of the insulator sheet.

16. A method of manufacturing a printed circuit board characterised in that a board comprising an insulator sheet and a copper layer laminated onto both sides of said insulator sheet is used, holes penetrating through from the front to the back of said board are provided, an electrically conductive polymer layer is provided on insulator wall surfaces of said through holes by simultaneously subjecting said insulator outer surface and the copper layer outer surface to the following processes (1)-(4) in this sequence: (1) a process comprising treatment with an alkali metal hydroxide solution, (2) a process comprising treatment with an alkaline aqueous solution containing an aliphatic amine, (3) a process comprising treatment with an alkaline aqueous solution having a permanganate concentration of 0.3 to 3.5 wt % and a pH of 8 to 11, (4) a process comprising treatment with an acidic microemulsion aqueous solution containing a thiophene compound and an alkali metal salt of polystyrenesulphonic acid, after which the through holes and the copper layer provided with the electrically conductive polymer layer are subjected to copper plating by means of a copper electroplating process (5), after which a patterned mask is formed on the layer of copper plating using a photolithographic method, the portion of the layer of copper plating not covered by the patterned mask is removed by etching and the patterned mask is removed, thereby forming a patterned circuit and forming a layer of copper plating on the through hole wall surfaces.

17. The method of manufacturing a printed circuit board according to claim 16, characterised in that after the patterned circuit has been formed on the copper layer, plating is performed using tin, nickel, palladium, silver, gold, platinum or alloys thereof, individually or in combination.

18. The method of manufacturing a printed circuit board according to claim 16, characterised in that a metal layer other than copper constituting an adhesion reinforcing layer and a copper layer are laminated by this procedure on at least one surface of the insulator sheet.

* * * * *